US008153886B1

(12) United States Patent
Garboushian et al.

(10) Patent No.: US 8,153,886 B1
(45) Date of Patent: *Apr. 10, 2012

(54) METHOD OF IMPROVING THE EFFICIENCY OF LOOSELY PACKED SOLAR CELLS IN DENSE ARRAY APPLICATIONS

(75) Inventors: Vahan Garboushian, Torrance, CA (US); Alexander M. Slade, Hollywood Hills, CA (US)

(73) Assignee: Amonix, Inc., Seal Beach, CA (US)

( * ) Notice: Subject to any disclaimer, the term of this patent is extended or adjusted under 35 U.S.C. 154(b) by 794 days.

This patent is subject to a terminal disclaimer.

(21) Appl. No.: 10/969,577

(22) Filed: Oct. 20, 2004

Related U.S. Application Data

(60) Provisional application No. 60/512,888, filed on Oct. 20, 2003.

(51) Int. Cl.
*H01L 31/045* (2006.01)

(52) U.S. Cl. ........ 136/246; 136/256; 136/293; 136/244; 438/69; 438/72; 438/66; 438/73; 438/80; 257/436; 257/432; 257/717

(58) Field of Classification Search .................. 136/244, 136/246, 256, 293; 126/271; 438/66, 69, 438/72, 73, 80; 257/436, 432, 717
See application file for complete search history.

(56) References Cited

U.S. PATENT DOCUMENTS

| | | | | |
|---|---|---|---|---|
| 3,232,795 A | * | 2/1966 | Snyder et al. | 136/246 |
| 3,427,200 A | * | 2/1969 | Ernest et al. | 136/246 |
| 3,437,818 A | | 4/1969 | Shattuck | |
| 3,912,539 A | | 10/1975 | Magee | |
| 4,045,246 A | * | 8/1977 | Mlavsky et al. | 136/246 |
| 4,099,515 A | * | 7/1978 | Schertz | 126/661 |
| 4,118,249 A | * | 10/1978 | Graven et al. | 136/246 |
| 4,134,387 A | * | 1/1979 | Tornstrom | 126/684 |
| 4,180,414 A | * | 12/1979 | Diamond et al. | 136/246 |
| 4,323,719 A | | 4/1982 | Green | |
| 4,430,519 A | * | 2/1984 | Young | 136/244 |
| 4,456,782 A | | 6/1984 | Nishiura et al. | |
| 4,481,378 A | | 11/1984 | Lesk | |
| 4,836,861 A | * | 6/1989 | Peltzer et al. | 136/246 |
| 4,933,022 A | | 6/1990 | Swanson | |
| 5,118,361 A | * | 6/1992 | Fraas et al. | 136/246 |
| 5,123,968 A | * | 6/1992 | Fraas et al. | 136/246 |
| 5,167,724 A | * | 12/1992 | Chiang | 136/246 |
| 5,961,737 A | * | 10/1999 | Glenn | 136/244 |

(Continued)

OTHER PUBLICATIONS

U.S. Appl. No. 13/186,369, filed Jul. 19, 2011, Kinsey et al.

*Primary Examiner* — Alexa Neckel
*Assistant Examiner* — Golam Mowla
(74) *Attorney, Agent, or Firm* — Wilson Sonsini Goodrich & Rosati

(57) ABSTRACT

An increased efficiency Concentrator Photovoltaic System having a plurality of solar cells laterally spaced from each other on a substrate panel. The solar cells are mounted on electrically conductive areas of an otherwise non-conductive top surface of the substrate with each cell isolated from another by a non-conductive area. The individual cells are connected using ribbons or wires, between the front contact of the solar cells to the conductive area of another cell to form a circuit connecting the cells in a desired configuration. A plurality of tubular enclosures for concentrating light on the solar cells are mounted directly above the solar cells.

13 Claims, 3 Drawing Sheets

U.S. PATENT DOCUMENTS

| | | | |
|---|---|---|---|
| 6,020,555 A * | 2/2000 | Garboushian et al. | 136/256 |
| 6,051,776 A * | 4/2000 | Kimata et al. | 136/246 |
| 6,091,020 A * | 7/2000 | Fairbanks et al. | 136/259 |
| 6,123,067 A | 9/2000 | Warrick | |
| 6,177,627 B1 * | 1/2001 | Murphy et al. | 136/246 |
| 6,188,012 B1 * | 2/2001 | Ralph | 136/246 |
| 6,248,948 B1 | 6/2001 | Nakagawa et al. | |
| 6,399,874 B1 * | 6/2002 | Olah | 136/259 |
| 6,528,716 B2 * | 3/2003 | Collette et al. | 136/246 |
| 6,531,653 B1 * | 3/2003 | Glenn et al. | 136/246 |
| 6,559,371 B2 | 5/2003 | Shingleton et al. | |
| 7,877,937 B2 | 2/2011 | Dutra | |
| 2003/0155003 A1 * | 8/2003 | Tur et al. | 136/246 |
| 2003/0201007 A1 * | 10/2003 | Fraas et al. | 136/246 |

* cited by examiner

METHOD OF IMPROVING THE EFFICIENCY OF LOOSELY PACKED SOLAR CELLS IN DENSE ARRAY APPLICATIONS

This patent application claims the priority date of U.S. Provisional Patent Application No. 60/512,888 filed Oct. 20, 2003.

BACKGROUND OF THE INVENTION

1. Field of the Invention

The present invention relates to the assembly of solar cells into an array for the conversion of solar energy from a large area concentrator, typically a parabolic reflector or the optical equivalent constructed of mirror segments, either flat or figured, into electricity. More specifically it applies to the methodology of maximizing the fraction of sunlight captured by the concentrator that is converted into electrical power.

2. Prior Art

Traditional one sun solar panels are made by simply bonding solar cells to a substrate, such as aluminum honeycomb panels, and interconnecting the cells with metal ribbons front to back. The cells are spaced slightly apart to allow the interconnecting ribbons to pass between the adjacent cells. Furthermore the entire front surface area of the cell may not be active due to the necessity of a front surface contact to which the ribbons are bonded. The space between cells active areas are of little consequence, since sunlight bathes the entire surface of the earth more or less uniformly, and the power output of a loosely packed panel will be the same as a closely packed one. Excessive spacing might lead to a slightly higher manufacturing cost due to a larger than necessary substrate, and a marginally lower system efficiency, but from a practical standpoint packing density is not a major concern for one sun solar panels.

Concentrator PV systems, systems which use ancillary optics to intensify the light striking the solar cell, make the available illuminated area a cost driven commodity since the light striking the solar cells is no longer free, but has been preconditioned by costly hardware. If the system uses multiple concentrator elements, such as a parquet of Fresnel lenses, the output of a single concentrator element can be directed to a single cell, and light utilization approximates 100%. If the concentrator consists of one or more large concentrating elements, such as a parabolic dish, or optical equivalent packing density becomes very important. Every bit of concentrated sunlight that falls between the active areas of solar cells is lost, resulting directly in reduced system efficiency.

To further compound the problem in dense arrays, in addition to the solar cell area lost to top surface contacts, most solar cells require individual diode protection across each cell in an array. These diodes are discrete components and require some physical area on the substrate for mounting. Heretofore the only solution to this problem has been to utilize only back contact cells, packed as tightly as possible and use diode protection only across large segments of the cells which can be reached through connections at the periphery of the field of solar cells.

SUMMARY OF THE INVENTION

The principle object of the present invention is to provide a method for utilization of the light falling between active areas of loosely packed solar cells. Secondarily, this invention provides protection from highly concentrated sunlight to the areas between cells, to permit these areas to act as protective enclosures for interconnecting wiring, and discrete diodes. This invention is comprised of a matrix of reflective surfaces interconnected tent fashion, over the intercellular areas of the substrate. These reflective surfaces reflect the sunlight, or a portion thereof, back to the active areas of the solar cells. They may be oriented symmetrical about an axis normal to the substrate or skewed to accommodate a conical beam of concentrated sunlight, as from a circular parabolic mirror, or at some other angle to accommodate most efficiently the incoming sunlight from a non symmetrical primary reflector. In the simplest embodiment of the invention, these reflective surfaces might take the form of highly polished sheet metal formed into an inverted V-shaped tent extending between active areas of rows of cells tightly packed in one direction only. In a more complex embodiment, the reflective surfaces would be electroformed upon a master tool with each surface oriented to produce maximum utilization of a non-collimated source of concentrated sunlight. Other manufacturing techniques including, but not limited to, electron beam welding, laser welding, laser cutting, chemical etching, and injection molding, might be used to create the matrix of reflective surfaces.

DESCRIPTION OF THE PREFERRED EMBODIMENT

Figure 1:
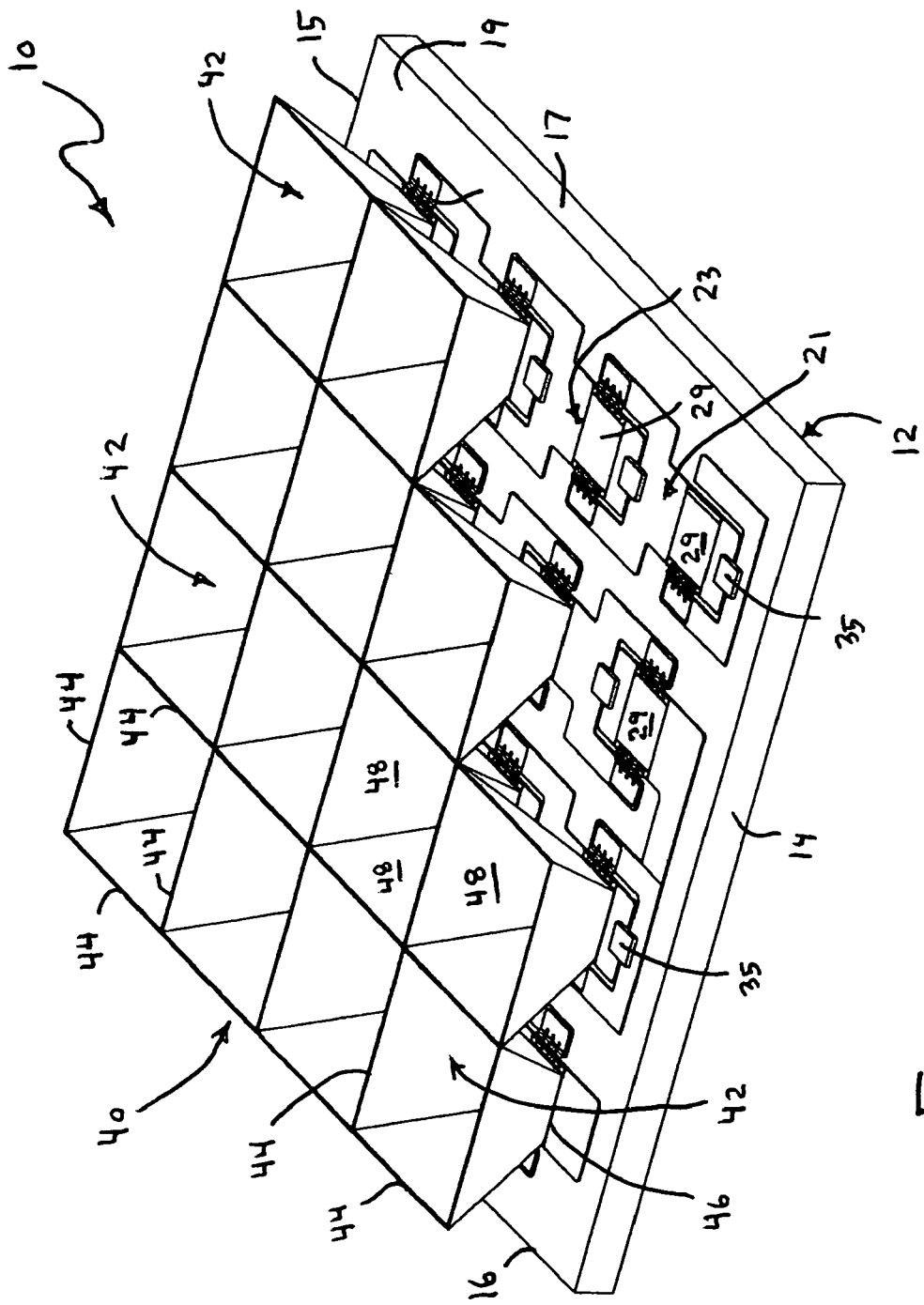
FIG. 1 is a schematic perspective view of a solar array of solar cells.
Figure 2:
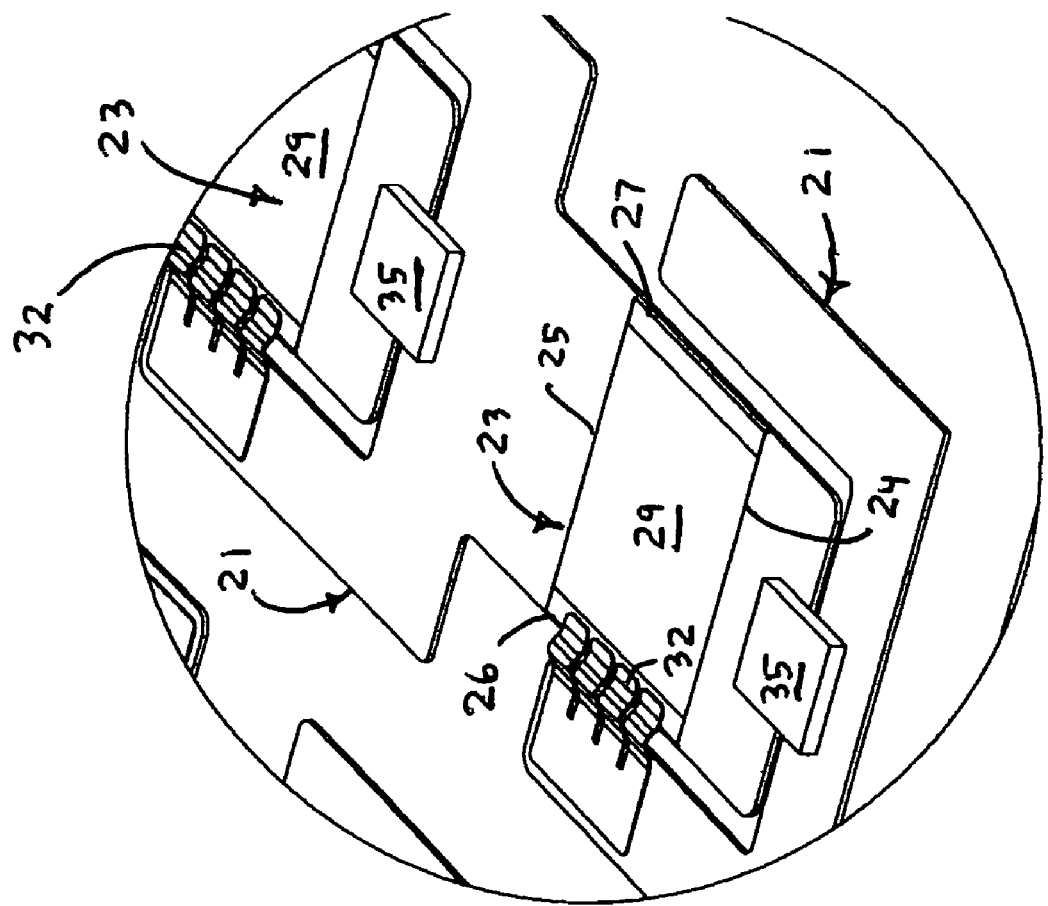
FIG. 2 is an enlarged view taken along a circular line in FIG. 1.

The increased efficiency Concentrator Photovoltaic (PV) System will now be described by referring to FIGS. 1 and 2 of the drawings. The PV System is generally designated numeral 10. It has a substrate 12 having a front end 14, a rear end 15, a left end 16, a right end 17 and a top surface 19. Substrate 12 may be made of a non-electrical conducting material or a conducting material such as metal in which the top surface has been rendered non-conductive by application of a surface treatment or coating on the non-conductive material.

A plurality of metal traces 21 are located on top surface 19 and they provide a surface upon which the solar cells 23 can be supported and also provide a path for the electrical output of the individual solar cells 23. The solar cells 23 have a front edge 24, a rear edge 25, a left edge 26, a right edge 27 and a top surface 29. Top surface 29 is the active area that receives the solar rays that produce electricity. Metal ribbons/wires 32 provide a connection between the side edge contacts of the solar cells 23 and the metal traces 21 to form a circuit connecting the cells in the desired configuration, series, parallel or independent. Additional circuit components, such as protective diodes 35 are also shown in the intercellular areas which encompasses all of the areas surrounding the various solar cells that exist between adjacent solar cells.

The intercellular areas are protected from the solar rays by a lattice or matrix 40 of tubular enclosures 42 positioned above the respective intercellular areas. The tubular enclosures 42 have an open top end defined by top edges 44 and have a predetermined circumference. The open bottom end is defined by bottom edges 46 that have a predetermined circumference. The tubular enclosures have walls 48 extending from their top edges to their bottom edges and they have reflective inner wall surfaces. The reflective surface of walls 48 redirects the sunlight, normally falling on the intercellular zones, back onto the active area 29 of the solar cells 23. The structure of the metal shield or matrix 40 as depicted in FIG. 1 is of intermediate complexity and could be formed by electroforming the entire matrix upon a master tool in one single operation, or by forming pyramid shaped sub-components from flat stock and welding or brazing them into the structure as shown.

Figure 3:
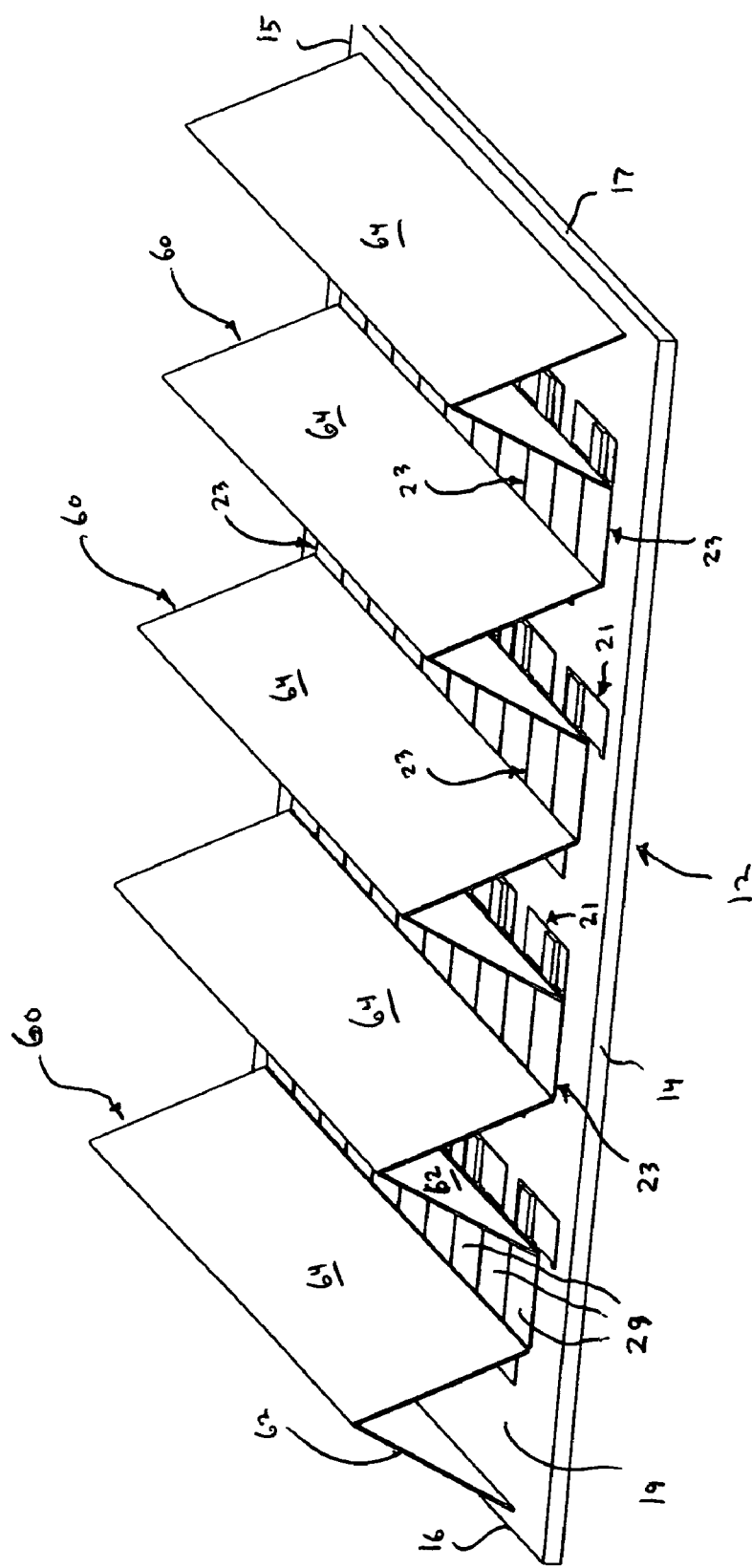
FIG. 3 is a schematic perspective view of a first alternative embodiment of the solar array of solar cells.

If the incoming light were asymmetrical, then the angles of the individual facets of the reflective shield would have to be adjusted accordingly and an electro formed structure would be the preferred embodiment. If the circuit were simplified to require protection only on two sides of the cell, the cells could be packed tightly in one direction and the protective shield 60 would consist only of a folded thin sheet metal structure as illustrated in FIG. 3. Protective shield 60 would have an inverted V-shape formed of elongated panels 62 and 64 that would have their bottom edges positioned adjacent to the respective left and right side edges 26 and 27 of solar cells 23. The front and rear edges 24 and 25 would be positioned adjacent each other in a column of solar cells 23.

The upper surface of the protective metal shield is treated to provide a highly reflective surface which redirects the sunlight, regularly falling into the intercellular zone, back onto the active area of solar cell. The structure of the metal shield as depicted in FIG. 1 is of intermediate complexity and could be formed by electroforming the entire matrix upon a master tool in one single operation, or by forming pyramid shaped sub components from flat stock and welding or brazing them into the structure as shown.

If the incoming light were asymmetrical, then the angles of the individual facets of the reflective shield would have to be adjusted accordingly and an electroformed structure would be the preferred embodiment. If the circuitry were simplified to require protection only on two sides of the cell, the cells could be packed tightly in one direction and the protective shield would consist only of a folded thin sheet metal structure.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and the number and configuration of various components described above may be altered, all without departing from the spirit or scope of the invention as defined in the appended Claims.

What is claimed is:

1. An increased efficiency Concentrator Photovoltaic System comprising:
    a plurality of solar cells each having a top surface, a front edge, a rear edge, a left edge and a right edge, at least one of the left and right edges including electrical contacts;
    a substrate having a non-conductive top surface having a plurality of conductive areas disposed thereon, the conductive areas being separated by non-conductive intercellular areas, each of the plurality of conductive areas having a leg portion and a U-shaped portion, each of the conductive areas configured such that one of the plurality of solar cells is disposed on the leg portion of one of the conductive areas, the U-shaped portion of each conductive area having two extending members separated by a space sized to receive the leg portion of an adjacent conductive area while maintaining the non-conductive intercellular area between the leg portion of the adjacent conductive area and U-shaped portion of another conductive area;
    electrical connectors in electrical communication with the electrical contacts of each solar cell to connect the solar cells to at least one of the extending members of the U-shaped portion of an adjacent conductive area to bridge the non-conductive intercellular areas;
    a plurality of diodes, each of the plurality of diodes associated with one of the plurality of solar cells, each diode connecting each conductive area to an adjacent conductive area; and
    a plurality of tubular enclosures each having an open top end, an open bottom end and having reflective inner wall surfaces; said open top ends having a greater circumference than that of said open bottom ends; some of said tubular enclosures being mounted directly above some of said solar cells so that solar rays regularly directed at said intercellular areas will be redirected by reflection to said respective solar cells thereby increasing the electricity producing efficiency of said Photovoltaic system.

2. An increased efficiency Concentrator Photovoltaic System as recited in claim 1 wherein at least one top edge of said open top ends of adjacent tubular enclosures are connected together to form a matrix that shields their respective intercellular areas.

3. An increased efficiency Concentrator Photovoltaic System as recited in claim 2 wherein said solar cells are aligned in rows and columns and said tubular enclosures are aligned in rows and columns.

4. An increased efficiency Concentrator Photovoltaic System as recited in claim 2 wherein said adjacent tubular enclosures have been connected together by electron beam welding.

5. An increased efficiency Concentrator Photovoltaic System as recited in claim 2 wherein said adjacent tubular enclosures have been connected together by laser welding.

6. An increased efficiency Concentrator Photovoltaic System as recited in claim 2 wherein said adjacent tubular enclosures have been connected together by injection molding.

7. An increased efficiency Concentrator Photovoltaic System as recited in claim 1 wherein said substrate is made of non-electrical conducting material.

8. An increased efficiency Concentrator Photovoltaic System as recited in claim 1 wherein said substrate is made of a conducting material in which the top surface has been rendered non-conductive by application of a surface treatment of non-conductive material.

9. An increased efficiency Concentrator Photovoltaic System as recited in claim 1 wherein said substrate is made of a conducting material in which the top surface has been rendered non-conductive by application of a surface coating of non-conductive material.

10. An increased efficiency Concentrator Photovoltaic System comprising:
    a plurality of solar cells each having a top surface, a front edge, a rear edge, a left edge and a right edge, at least one of the left and right edges including electrical contacts;
    a substrate having a non-conductive top surface having a plurality of conductive areas disposed thereon, the conductive areas being separated by non-conductive intercellular areas, each of the plurality of conductive areas having a leg portion and a U-shaped portion, each of the conductive areas configured such that one of the plurality of solar cells is disposed on the leg portion of one of the conductive areas, the U-shaped portion of each conductive area having two extending members separated by a space sized to receive the leg portion of an adjacent conductive area while maintaining the non-conductive intercellular area between the leg portion of the adjacent conductive area and the U-shaped portion of another conductive area;

electrical connectors in electrical communication with the electrical contacts of each solar cell to connect the solar cells to at least one of the extending members of the U-shaped portion of an adjacent conductive area to bridge the non-conductive intercellular areas; and a plurality of inverted V-shaped protective shields formed of elongated panels that would have their bottom edges positioned adjacent to said respective left and right edges of said solar cells; said front and rear edges of said respective solar cells would be adjacent each other in a column of solar cells so that solar rays regularly directed at said intercellular areas will be redirected by reflection to said respective solar cells thereby increasing the electricity producing efficiency of said Photovoltaic System.

11. An increased efficiency Concentrator Photovoltaic System as recited in claim 10 wherein said substrate is made of non-electrical conducting material.

12. An increased efficiency Concentrator Photovoltaic System as recited in claim 10 wherein said substrate is made of a conducting material in which the top surface has been rendered non-conductive by application of a surface treatment of non-conductive material.

13. An increased efficiency Concentrator Photovoltaic System as recited in claim 10 wherein said substrate is made of a conducting material in which the top surface has been rendered non-conductive by application of a surface coating of non-conductive material.

* * * * *